United States Patent
Kaneko et al.

(10) Patent No.: US 9,923,126 B2
(45) Date of Patent: Mar. 20, 2018

(54) LIGHT EMITTING DEVICE HAVING HIGH COLOR RENDERING USING THREE PHOSPHOR TYPES

(71) Applicant: SHARP KABUSHIKI KAISHA, Sakai, Osaka (JP)

(72) Inventors: Kazuaki Kaneko, Sakai (JP); Hiroaki Onuma, Sakai (JP); Makoto Matsuda, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 0 days.

(21) Appl. No.: 15/307,098

(22) PCT Filed: Apr. 10, 2015

(86) PCT No.: PCT/JP2015/061201
§ 371 (c)(1),
(2) Date: Oct. 27, 2016

(87) PCT Pub. No.: WO2015/166782
PCT Pub. Date: Nov. 5, 2015

(65) Prior Publication Data
US 2017/0047488 A1   Feb. 16, 2017

(30) Foreign Application Priority Data
Apr. 30, 2014   (JP) ................. 2014-093760

(51) Int. Cl.
*H01L 33/50* (2010.01)
*H01L 33/62* (2010.01)
*H01L 25/075* (2006.01)

(52) U.S. Cl.
CPC ............ *H01L 33/504* (2013.01); *H01L 33/62* (2013.01); *H01L 25/0753* (2013.01);
(Continued)

(58) Field of Classification Search
CPC ...................................... H01L 33/504
See application file for complete search history.

(56) References Cited

U.S. PATENT DOCUMENTS 8,183,758 B2* 5/2012 Okishiro ........... G02F 1/133604
                                                          252/301.4 R
9,087,968 B2* 7/2015 Lee ..................... H01L 33/0095
(Continued)

FOREIGN PATENT DOCUMENTS

JP   2012-056970   3/2012
JP   2012-079855   4/2012
(Continued)

OTHER PUBLICATIONS

English Translation of Written Opinion for PCT/JP2015/061201 filed Apr. 2015, 5 pages.*
(Continued)

*Primary Examiner* — Evan Pert
(74) *Attorney, Agent, or Firm* — ScienBiziP, P.C.

(57) ABSTRACT

The light emitting device includes at least one light emitting element that emits light having a peak emission wavelength in a wavelength range from 380 nm to 480 nm inclusive; a first green phosphor that is excited by the primary light emitted by the light emitting element and emits light having the peak emission wavelength in the green region; a second green phosphor that is excited by the primary light and emits light having the peak emission wavelength in the green region; and a red phosphor that is excited by the primary light and emits light having the peak emission wavelength in the red region. The peak emission wavelength of the light emitted by the second green phosphor is shorter than the peak emission wavelength of the light emitted by the first green phosphor.

5 Claims, 4 Drawing Sheets

(52) U.S. Cl.
CPC .. *H01L 33/507* (2013.01); *H01L 2224/48091* (2013.01); *H01L 2224/48137* (2013.01)

(56) References Cited

U.S. PATENT DOCUMENTS

| | | | |
|---|---|---|---|
| 2010/0027244 A1* | 2/2010 | Wada | H01J 65/046 |
| | | | 362/97.1 |
| 2010/0277054 A1 | 11/2010 | Takashima et al. | |
| 2012/0080713 A1 | 4/2012 | Agatani et al. | |
| 2012/0112616 A1* | 5/2012 | Kim | H05K 7/20963 |
| | | | 313/46 |
| 2012/0274240 A1* | 11/2012 | Lee | H01L 33/0095 |
| | | | 315/312 |
| 2012/0286647 A1* | 11/2012 | Schmidt | C04B 35/581 |
| | | | 313/503 |
| 2012/0300432 A1 | 11/2012 | Matsubayashi et al. | |
| 2012/0319565 A1 | 12/2012 | Sakuta et al. | |
| 2013/0249389 A1* | 9/2013 | Ishiwata | H01L 33/502 |
| | | | 313/512 |
| 2013/0300282 A1 | 11/2013 | Mori et al. | |
| 2015/0049459 A1 | 2/2015 | Peeters et al. | |
| 2016/0329514 A1* | 11/2016 | Park | H01L 51/5036 |

FOREIGN PATENT DOCUMENTS

| | | |
|---|---|---|
| JP | 2013-033971 | 2/2013 |
| JP | 2013-201274 | 10/2013 |
| WO | WO 2011/108203 | 9/2011 |
| WO | WO 2012/104937 | 8/2012 |
| WO | WO 2013/150470 | 10/2013 |

OTHER PUBLICATIONS

International Search Report for PCT/JP2015/061201, dated Jun. 2, 2015, 4 pages.

* cited by examiner (a)

(b)

LIGHT EMITTING DEVICE HAVING HIGH COLOR RENDERING USING THREE PHOSPHOR TYPES

This application is the U.S. national phase of International Application No. PCT/JP2015/061201 filed 10 Apr. 2015, which designated the U.S. and claims priority to JP Patent Application No. 2014-093760 filed 30 Apr. 2014, the entire contents of each of which are hereby incorporated by reference.

TECHNICAL FIELD

The present invention relates to a light emitting device that can be used as a light source for a lighting fixture or display device, and in particular to a light emitting device that makes a specific color look clear.

BACKGROUND ART

There have been active studies and development of light emitting devices having semiconductor light emitting elements and phosphors, which are gaining attention as the next-generation light emitting devices expected to achieve lower power consumption, reduction of size, high intensity, and further a wide range of color reproducibility. The primary light emitted by a semiconductor light emitting element typically has a peak emission wavelength in the near-ultraviolet region to the blue region, having the peak emission wavelength in a wavelength range from 380 nm to 480 nm inclusive, for example. Light emitting devices using various kinds of phosphor tailored for specific applications have been proposed as well.

A variety of light emitting devices for use as lighting devices have been also developed, with various approaches to improving the output performance of such light emitting devices under study. For enhancement of the output performance of a light emitting device, a phosphor having a major emission peak in the yellow region, which has high luminous efficacy and represents the complementary color of blue, is typically employed. For a light emitting device that can be used for generic lighting fixtures, having high color rendering properties (the term "having high color rendering properties" essentially means having an average color rendering index Ra of 80 or higher) is also an important feature in addition to improvement of its output performance.

The average color rendering index Ra is a metric generally used as an indicator of color rendering properties based on assessment of whether test colors (R1 to R8) look natural or not. For light emitting devices useable as generic lighting fixtures, making the test colors look natural is important: increasing the average color rendering index Ra is an important consideration. In the case of a lighting fixture using a light emitting diode (LED) light source, however, light emitted by an LED light source has notably high emission peaks in the blue and yellow regions compared to a traditional light source such as a high intensity discharge lamp. As a result, the color of an illuminated object can look dull even when the light source has a high average color rendering index Ra. This is because yellow is generally a hue indicative of fading of color and thus makes the illuminated object look as if faded.

In the fashion industry, for example, light emitting devices that make illuminated objects look yellowish are tend to be avoided because they impair the clearness of illuminated objects. For such light emitting devices that are used in sales of articles and the like, a premium is often placed on how the illuminated object looks in addition to the demand for merely ensuring brightness.

To meet this demand, an LED lamp having an LED light source and a filter is described in International Publication No. 2011/108203 Pamphlet (PTL 1), for instance. The LED light source described in PTL 1 includes a blue LED having a major emission peak in a wavelength region from 440 nm to 460 nm, a green or yellow phosphor to be excited by the light emitted by the blue LED, and a red phosphor to be excited by the light emitted by at least one of the blue LED and the green or yellow phosphor. The filter described in PTL 1 reduces the spectral radiant intensity in at least part of a wavelength region from 570 nm to 590 nm of the light emitted by the LED light source. PTL 1 describes that use of the filter for reducing the spectral radiant intensity in a specific wavelength region and inclusion of a red phosphor in the LED light source can make not only medium saturated colors (according to PTL 1, the medium saturated colors are defined as the test colors with medium saturation, R1 to R8) but a clear red color look natural. The LED lamp described in PTL 1 includes a filter, however, which adds to operations in the manufacturing process of the LED lamp and hence increases its manufacturing costs. Additionally, because the filter decreases the spectral radiant intensity in at least part of the wavelength region from 570 nm to 590 nm, it causes reduction in power efficiency of the lighting device.

International Publication No. 2012/104937 Pamphlet (PTL 2) describes a high-saturation LED module capable of improving the clearness of the color of an illuminated object even when the ambient light has a high correlated color temperature and consequently reproducing the color favorably. According to descriptions in PTL 2, a correlated color temperature is from 4600 K to 7200 K inclusive and a distance from perfect radiator locus on uv-ordinates (duv) is from −12 to −6 inclusive. As a result of duv being from −12 to −6 inclusive, the reddish component relatively increases, which can enhance the color reproducibility, particularly the color reproducibility in the red region. However, large deviation of the chromaticity range from the blackbody locus increases the reddishness of the color of the emitted light itself, which in turn can make an illuminated object look reddish.

International Publication No. 2013/150470 Pamphlet (PTL 3) describes that "crisp white" can be provided by use of a light emitting element that emits light in the near-ultraviolet region and a light emitting element that emits light in the blue region. Incorporation of a light emitting element that emits light in the near-ultraviolet region however causes no change in the emission peak in the yellow region, leaving the inherent possibility of an illuminated object looking yellowish.

CITATION LIST

Patent Literature

PTL 1: International Publication No. 2011/108203 Pamphlet
PTL 2: International Publication No. 2012/104937 Pamphlet
PTL 3: International Publication No. 2013/150470 Pamphlet

SUMMARY OF INVENTION

Technical Problem

The present invention is intended to provide a light emitting device that can make an illuminated object look clear.

Solution to Problem

A light emitting device according to the present invention includes at least one light emitting element that emits light having a peak emission wavelength in a wavelength range from 380 nm to 480 nm inclusive; a first green phosphor that is excited by primary light emitted by the light emitting element and emits light having the peak emission wavelength in a green region; a second green phosphor that is excited by the primary light and emits light having the peak emission wavelength in the green region; and a red phosphor that is excited by the primary light and emits light having the peak emission wavelength in a red region. The peak emission wavelength of the light emitted by the second green phosphor is shorter than the peak emission wavelength of the light emitted by the first green phosphor.

A light emission spectrum of the light emitting device preferably has a first peak with a first emission peak wavelength in a wavelength range from 380 nm to 480 nm inclusive, a second peak with a second emission peak wavelength in a wavelength range from 485 nm to 580 nm inclusive, and a third peak with a third emission peak wavelength in a wavelength range from 610 nm to 660 nm inclusive. In the light emission spectrum, a first light emission intensity at the first emission peak wavelength is preferably lower than a second light emission intensity at the second emission peak wavelength and is preferably lower than a third light emission intensity at the third emission peak wavelength. The second light emission intensity at the second emission peak wavelength is preferably lower than the third light emission intensity at the third emission peak wavelength. The light emission spectrum preferably has a shape that projects to a side of lower light emission intensity in a range of wavelengths longer than the second emission peak wavelength and shorter than the third emission peak wavelength.

In the light emission spectrum, when the first light emission intensity is represented as $I_1$, the second light emission intensity is represented as $I_2$, the third light emission intensity is represented as $I_3$, a fourth light emission intensity at a wavelength of 540 nm is represented as $I_4$, a fifth light emission intensity at a wavelength of 560 nm is represented as $I_5$, and a sixth light emission intensity at a wavelength of 580 nm is represented as $I_6$, a light emission intensity ratio of the first light emission intensity $I_1$ to the third light emission intensity $I_3$ ($I_1/I_3 \times 100$) is preferably from 35.7 to 47.1 inclusive, the light emission intensity ratio of the second light emission intensity $I_2$ to the third light emission intensity $I_3$ ($I_2/I_3 \times 100$) is preferably from 43.9 to 59.1 inclusive, the light emission intensity ratio of the fourth light emission intensity $I_4$ to the third light emission intensity $I_3$ ($I_4/I_3 \times 100$) is preferably from 45.5 to 54.6 inclusive, the light emission intensity ratio of the fifth light emission intensity $I_5$ to the third light emission intensity $I_3$ ($I_5/I_3 \times 100$) is preferably from 52.1 to 61.5 inclusive, and the light emission intensity ratio of the sixth light emission intensity $I_6$ to the third light emission intensity $I_3$ ($I_6/I_3 \times 100$) is preferably from 60.2 to 72.7 inclusive. The light emitting device preferably emits light having a correlated color temperature of from 2757 K to 3113 K inclusive.

An excitation spectrum of the second green phosphor preferably has an excitation peak in each of a wavelength range from 380 nm to 480 nm inclusive, which is a wavelength region in which the peak emission wavelength of the light emitted by the light emitting element is present, and a wavelength range with shorter wavelengths than the wavelength region in which the peak emission wavelength of the light emitted by the light emitting element is present.

The light emitting device preferably further includes a substrate; and a resin dam of an annular shape in plan view, a wiring pattern, an electrode land, and a wire, which are provided on an upper surface of the substrate. In a portion of the upper surface of the substrate that is positioned on an inner side of the resin dam, the at least one light emitting element and a sealing resin layer containing the first green phosphor, the second green phosphor, and the red phosphor are preferably provided. At least part of the wiring pattern is preferably covered by the resin dam. The electrode land is preferably provided in a portion of the upper surface of the substrate that is positioned on an outer side of the resin dam, and preferably is electrically connected with the wiring pattern. The wire preferably electrically connects at least the light emitting element and the wiring pattern with each other.

The difference between the peak emission wavelength of the light emitted by the first green phosphor and the peak emission wavelength of the light emitted by the second green phosphor [(the peak emission wavelength of the light emitted by the first green phosphor)−(the peak emission wavelength of the light emitted by the second green phosphor)] is preferably from 20 nm to 60 nm inclusive.

Advantageous Effects of Invention

The light emitting device according to the present invention can make an illuminated object look clear.

DESCRIPTION OF EMBODIMENTS

Figure 1:
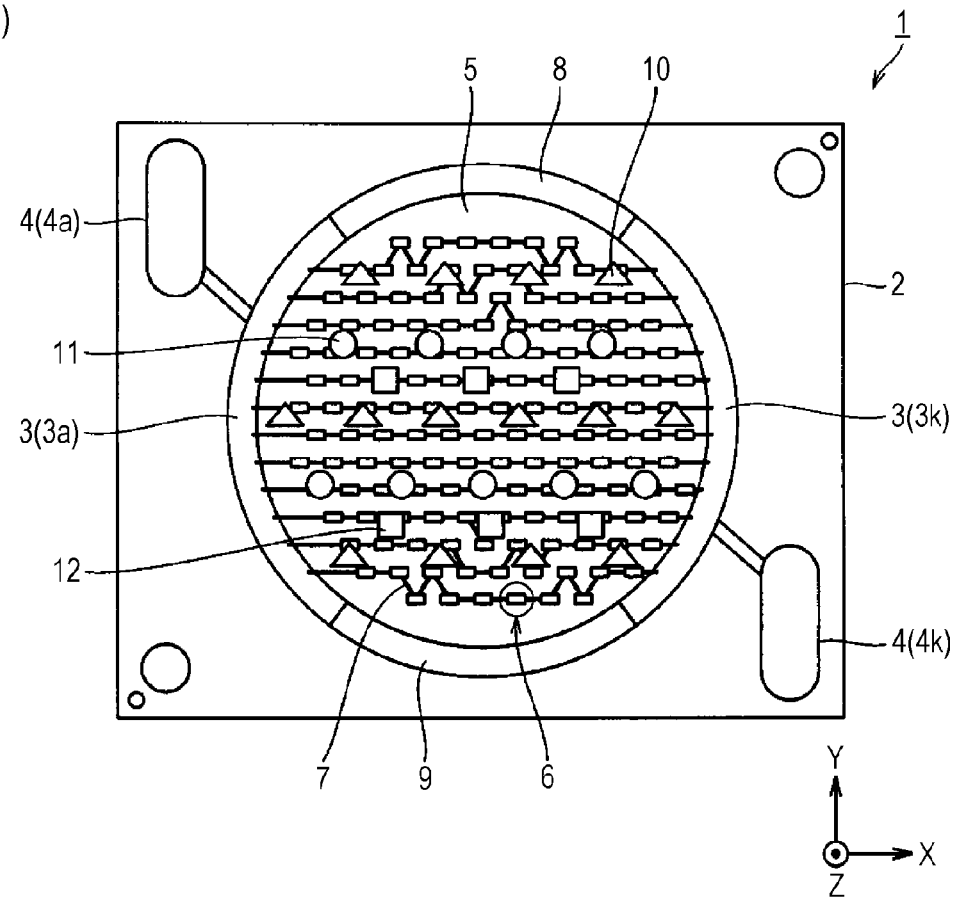
FIG. 1(a) is a schematic planar view showing the light emitting device in an embodiment of the present invention.
FIG. 1(b) is a cross-sectional view of the same.
Figure 1:
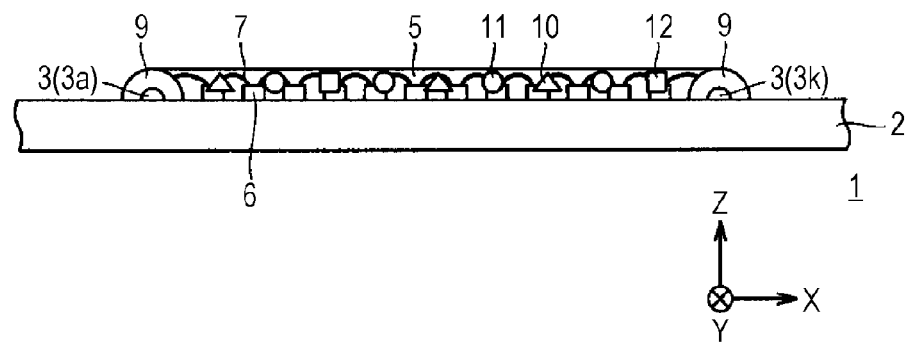

The light emitting device according to the present invention will be described below using the drawings. In the drawings of the present invention, the same reference sign denotes the same portion or an equivalent portion. Relations of dimensions, such as length, width, thickness, and depth, are changed as appropriate for the sake of clarity and simplification of drawings and do not represent the actual dimensional relations.

First Embodiment

FIG. 1(a) is a schematic planar view showing an example of the light emitting device in a first embodiment of the present invention, and FIG. 1(b) is a cross-sectional view showing key features of the light emitting device seen along X-Z direction, that is, cutting light emitting elements 6 and a wire 7. In FIG. 1(a), the inside of a light emitting device 1 is depicted as if transparent in order to clearly show the relations of connection between a wiring pattern 3 (3a, 3k) and the light emitting elements 6, and between light emitting elements 6.

(Light Emission Characteristics and Light Emission Spectrum of the Light Emitting Device)

The light emitting device 1 in this embodiment includes at least one light emitting element 6, a first green phosphor 10, a second green phosphor 11, and a red phosphor 12. The light emitting element 6 emits light having the peak emission wavelength in a wavelength range from 380 nm to 480 nm inclusive. The first green phosphor 10 is excited by the primary light emitted by the light emitting element 6 and emits light having the peak emission wavelength in the green region. The second green phosphor 11 is excited by the primary light emitted by the light emitting element 6 and emits light having the peak emission wavelength in the green region. The peak emission wavelength of the light emitted by the second green phosphor 11 is shorter than that of the light emitted by the first green phosphor 10. The red phosphor 12 is excited by the primary light emitted by the light emitting element 6 and emits light having the peak emission wavelength in the red region. This can enhance the color rendering properties of the light emitting device 1.

Inclusion of the second green phosphor 11 in the light emitting device 1 can reduce the light emission intensity in the blue region (a region with wavelengths of from 380 nm to 480 nm inclusive) and the light emission intensity in the yellow region (a region with wavelengths of from 540 nm to 580 nm inclusive). This can make an illuminated object look clear. For example, when a white object is illuminated with light from the light emitting device 1, the illuminated object can be made look clear white rather than yellowish white. The light emitting device 1 accordingly is suitable for use in sale of articles and the like, in the fashion industry in particular.

The difference between the peak emission wavelength of the light emitted by the first green phosphor 10 and the peak emission wavelength of the light emitted by the second green phosphor 11 [(the peak emission wavelength of the light emitted by the first green phosphor 10)–(the peak emission wavelength of the light emitted by the second green phosphor 11)] is preferably from 20 nm to 60 nm inclusive.

As noted above, the light emitting device 1 includes the first green phosphor 10, the second green phosphor 11, and the red phosphor 12. Accordingly, the spectrum of the light emitted by light emitting device 1 (the light emission spectrum of the light emitting device 1) has a first peak with a first emission peak wavelength in a wavelength range from 380 nm to 480 nm inclusive, a second peak with a second emission peak wavelength in a wavelength range from 485 nm to 580 nm inclusive, and a third peak with a third emission peak wavelength in a wavelength range from 610 nm to 660 nm inclusive. In the light emission spectrum, a first light emission intensity at the first emission peak wavelength is preferably lower than a second light emission intensity at the second emission peak wavelength, and is preferably lower than a third light emission intensity at the third emission peak wavelength. The second light emission intensity at the second emission peak wavelength is preferably lower than the third light emission intensity at the third emission peak wavelength. Such a light emission spectrum also preferably has a shape that projects to the side of lower light emission intensity in a range of wavelengths longer than the second emission peak wavelength and shorter than the third emission peak wavelength. This can further keep the light emission intensities in the blue and yellow regions low, making an illuminated object look further clear.

More preferably, in the light emission spectrum of the light emitting device 1, a light emission intensity ratio of the first light emission intensity $I_1$ to the third light emission intensity $I_3$ ($I_1/I_3\times100$) is from 35.7 to 47.1 inclusive; the light emission intensity ratio of the second light emission intensity $I_2$ to the third light emission intensity $I_3$ ($I_2/I_3\times100$) is from 43.9 to 59.1 inclusive; the light emission intensity ratio of a fourth light emission intensity $I_4$ to the third light emission intensity $I_3$ ($I_4/I_3\times100$) is from 45.5 to 54.6 inclusive; the light emission intensity ratio of a fifth light emission intensity $I_5$ to the third light emission intensity $I_3$ ($I_5/I_3\times100$) is from 52.1 to 61.5 inclusive; and the light emission intensity ratio of a sixth light emission intensity $I_6$ to the third light emission intensity $I_3$ ($I_6/I_3\times100$) is from 60.2 to 72.7 inclusive. This can keep the light emission intensity in the yellow region further low. In addition, the light emitting device 1 more preferably emits light having a correlated color temperature of from 2757 K to 3113 K inclusive. This can make an illuminated object look further clear. The "correlated color temperature" herein is a value determined in conformance to JIS Z 8725 (methods for determining the distribution temperature and color temperature or correlated color temperature of a light source).

A specific method for gaining such a light emission spectrum can be optimization of the material, the content, or the material and content of at least one of the first green phosphor 10, the second green phosphor 11, and the red phosphor 12.

For the second green phosphor 11, a green phosphor having the following excitation spectrum is preferably used: the excitation spectrum of the second green phosphor 11 preferably has an excitation peak in each of a wavelength region (a wavelength range from 380 nm to 480 nm inclusive) in which the peak emission wavelength of the light emitted by the light emitting element 6 is present and a wavelength range with shorter wavelengths than the wavelength region (the wavelength range from 380 nm to 480 nm inclusive) in which the peak emission wavelength of the light emitted by the light emitting element 6 is present. Here, "the excitation spectrum of the second green phosphor 11" is determined by scanning the wavelength of the light that excites the second green phosphor 11 and measuring the light emission intensity at a particular wavelength of the light emitted by excitation of the second green phosphor 11.

In the present specification, "the first light emission intensity $I_1$ at the first emission peak wavelength" is referred just as to "the first light emission intensity $I_1$". Similarly, "the second light emission intensity $I_2$ at the second emission peak wavelength" is referred just as to "the second light emission intensity $I_2$", and "the third light emission intensity $I_3$ at the third emission peak wavelength" is referred just as to "the third light emission intensity $I_3$". "The fourth light emission intensity $I_4$ at a wavelength of 540 nm" is referred just as to "the fourth light emission intensity $I_4$"; "the fifth light emission intensity $I_5$ at a wavelength of 560 nm" is referred just as to "the fifth light emission intensity $I_5$"; and "the sixth light emission intensity $I_6$ at a wavelength of 580 nm" is referred just as to "the sixth light emission intensity $I_6$".

(Structure of the Light Emitting Device)

The light emitting device 1 preferably further includes a substrate 2, a wiring pattern 3 (3a, 3k), an electrode land 4 (4a, 4k), a sealing resin layer 5, a wire 7, a printed resistance element 8, and a resin dam 9.

The resin dam 9 is formed on the upper surface of the substrate 2 in an annular shape when the upper surface of the substrate 2 is seen from above (an annular shape in plan view). In a portion of the upper surface of the substrate 2 that is positioned on the inner side of the resin dam 9, the sealing resin layer 5 and at least one light emitting element 6 are disposed. The sealing resin layer 5 contains the first green phosphor 10, the second green phosphor 11, and the red phosphor 12.

The wiring pattern 3 (3a, 3k) is disposed on the upper surface of the substrate 2 and covered by the resin dam 9. The electrode land 4 (4a, 4k) is provided on the upper surface of the substrate 2 in a portion positioned on the outer side of the resin dam 9. The wire 7 electrically connects at least the light emitting element 6 and the wiring pattern 3 (3a, 3k) with each other. When two or more light emitting elements 6 are provided, those light emitting elements 6 are preferably interconnected via the wire 7. The components of the light emitting device 1 will be now described more specifically.

(Substrate, Wiring Pattern, and Electrode Land)

The substrate 2, formed in a rectangular shape in plan view, for example, may be a ceramic substrate or a metal substrate with insulating film formed on the surface, for example.

The wiring pattern 3 (3a, 3k) is formed on the upper surface of the substrate 2 so as to be located opposite each other, each being shaped in a section of a circular ring (an arc shape) in plan view. Such wiring pattern 3 (3a, 3k) is formed by screen printing, for example.

The electrode land 4 (4a, 4k) is an electrode for external connection (for example, for power supply) made of Ag—Pt, for example. The electrode land 4a is connected to one end of the wiring pattern 3a via a lead wire, while the electrode land 4k is connected to one end of the wiring pattern 3k via another lead wire. Such electrode land 4 (4a, 4k) is formed by screen printing, for example.

(Sealing Resin Layer)

Within the sealing resin layer 5, the first green phosphor 10, the second green phosphor 11, and the red phosphor 12 are evenly dispersed in transparent resin. Such a sealing resin layer 5 is formed in the following manner. First, the first green phosphor 10, the second green phosphor 11, and the red phosphor 12 are mixed evenly with transparent resin. The resulting mixed resin is injected into the portion of the upper surface of the substrate 2 that is positioned on the inner side of the resin dam 9. At the time of this process, at least one light emitting element 6 is already present in the portion of the upper surface of the substrate 2 that is positioned on the inner side of the resin dam 9. When two or more light emitting elements 6 are provided, those light emitting elements 6 have been interconnected via the wire 7. Heat processing is then performed, which causes the transparent resin to cure, resulting in the at least one light emitting element 6, the first green phosphor 10, the second green phosphor 11, and the red phosphor 12 being sealed (formation of the sealing resin layer 5).

The transparent resin contained in the sealing resin layer 5 may be any kind of resin that has optical transparency, preferably epoxy resin, silicone resin, or urea resin, for example. The sealing resin layer 5 may further contain a material different from the transparent resin, the first green phosphor 10, the second green phosphor 11, and the red phosphor 12, such as $SiO_2$, $TiO_2$, $ZrO_2$, $Al_2O_3$, or $Y_2O_3$ as additive. Inclusion of such additive in the sealing resin layer 5 can prevent sedimentation of the first green phosphor 10, the second green phosphor 11, the red phosphor 12, and the like. It can also efficiently scatter light from each of the light emitting element 6, the first green phosphor 10, the second green phosphor 11, and the red phosphor 12.

(First Green Phosphor)

Examples of the first green phosphor 10 may include a phosphor represented by general formula (A): $(M1)_{3-x}Ce_x(M2)_5O_{12}$ (in the general formula (A), (M1) represents at least one of Y, Lu, Gd, and La; (M2) represents at least one of Al and Ga; and x, which indicates the composition ratio (concentration) of Ce, satisfies $0.005 \leq x \leq 0.20$), $Ca_3(Sc,Mg)_2Si_3O_{12}$:Ce-based phosphor, a divalent europium activated oxynitride phosphor which is β-SiAlON represented by general formula $Eu_aSi_bAl_cO_dN_e$ (where a satisfies $0.005 \leq a \leq 0.4$; b and c satisfy $b+c=12$; and d and e satisfy $d+e=16$), a divalent europium activated silicate phosphor represented by general formula (B): $(M3)_{2-x}Eu_xSiO_4$ (in the general formula, (M3) represents at least one of Mg, Ca, Sr, and Ba; and x, which indicates the composition ratio (concentration) of Eu, satisfies $0.03 \leq x \leq 0.10$), a trivalent cerium activated phosphor represented by $La_{3-x}Ce_xSi_6N_{11}$ (where x satisfies $0.01 < x \leq 0.2$), (Ca, Sr, Ba) $SiAl_2O_3N_2$: Ce-based phosphor, $Ba_3Si_6O_{12}N_2$:Eu-based phosphor, or $(Sr,Ba)_2SiO_4$:Eu-based phosphor. The first green phosphor 10 may be a single one or a mixture of two or more of these phosphors. The term "green region" refers to a region with wavelengths of from 485 nm to 580 nm inclusive.

The half width of the fluorescence spectrum of the first green phosphor 10 is preferably wide, preferably 95 nm or more, for example. A phosphor using Ce as activator, for example, $Lu_{3-x}Ce_xAl_5O_{12}$-based green phosphor (a phosphor with (M1) being Lu and (M2) being Al in the general formula (A) above), has a garnet crystal structure. As this phosphor uses Ce as activator, it provides a fluorescence spectrum with a wide half width (a half width of 95 nm or more). A phosphor using Ce as activator thus makes a green phosphor suited for enhancing the color rendering properties of the light emitting device 1.

(Second Green Phosphor)

Examples of the second green phosphor 11 may include $BaSi_2(O,Cl)_2N_2$:Eu-based phosphor, a phosphor represented by general formula (C):$(M4)_{1-a}Eu_aSi_b(O_{1-c},(M5)_c)_bN_b$ (in general formula (C), (M4) represents at least one of Ca, Sr, and Ba; (M5) represents at least of F, Cl, and Br; a satisfies $0.01 \leq a \leq 0.50$; b satisfies $1.90 \leq b \leq 2.10$; and c satisfies $0.00 \leq c \leq 0.50$), $(Ca,Sr,Ba)SiAl_2O_3N_2$:Ce-based phosphor, $(Sr,Ba)_3SiO_b$:Eu-based phosphor, $(Sr,Ba)Al_2O_4$:Eu-based phosphor, or $(Sr,Ba)_4Al_{14}O_{25}$:Eu-based phosphor. The second green phosphor 11 may be a single one or a mixture of two or more of these phosphors.

(Red Phosphor)

Examples of the red phosphor 12 may include (Sr, Ca)$AlSiN_3$:Eu-based phosphor, $CaAlSiN_3$:Eu-based phosphor, a divalent europium activated nitride phosphor represented by general formula (D): $(M6)_{2-x}Eu_xSi_5N_8$ (in general formula (D), (M6) represents at least one of Mg, Ca, Sr, and Ba; and x, which indicates the composition ratio (concentration) of Eu, satisfies $0.01 \leq x \leq 0.30$), or a divalent europium activated oxynitride phosphor which is α-SiAlON represented by general formula (E):$[Eu_a(M7)_{1-a}]_xSi_bAl_cO_dN_e$ (in general formula (E), x satisfies $0.15 \leq x \leq 1.5$; a satisfies $0 \leq a \leq 1$; b and c satisfy $b+c=12$; d and e satisfy $d+e=16$; and (M7) represents at least one of Li, Na, K, Rb, Cs, Mg, Ca, Sr, Ba, Sc, Y, La, and Gd). The red phosphor 12 may be a single one or a mixture of two or more of these phosphors. Mixing of two or more from the foregoing phosphors enables higher selectivity of the average color rendering index Ra of the light emitting device 1.

The half width of the fluorescence spectrum of the red phosphor 12 is preferably wide, similarly to the first green phosphor 10. A desirable example of the red phosphor 12 thus can be (Sr, Ca)AlSiN$_3$:Eu-based phosphor or CaAlSiN$_3$:Eu-based phosphor.

(Light Emitting Element)

Because the light emitting element 6 emits light having the peak emission wavelength in the wavelength range from 380 nm to 480 nm inclusive, the contribution rate of light with the blue component relative to the light from the light emitting device 1 can be reserved. This can maintain high color rendering properties of the light emitting device 1 and hence increase its utility. In contrast, when a light emitting element having a peak emission wavelength of less than 380 nm is used, the contribution rate of light with the blue component relative to the light from the light emitting device is low, which leads to poor color rendering properties and hence could reduce the utility of the light emitting device. Likewise, with a light emitting element having a peak emission wavelength exceeding 480 nm, the contribution rate of light with the blue component relative to the light from the light emitting device is also low, possibly leading to lower utility of the light emitting device.

An LED chip for use as the light emitting element 6 is preferably a bare chip of a semiconductor light emitting element that emits light containing light having the peak emission wavelength in the blue region (the wavelength range from 380 nm to 480 nm inclusive) (light with the blue component), more preferably an InGaN-based LED chip. An example of the light emitting element 6 can be an LED chip with the peak emission wavelength of around 450 nm. The term "InGaN-based LED chip" means an LED chip in which the light emitting layer is an InGaN layer.

When two or more light emitting elements 6 are provided, the two or more light emitting elements 6 can be arranged in the following geometry as an example. Two or more light emitting elements 6 are die-bonded to the upper surface of the substrate 2 such that they are arranged substantially parallel to one side of the substrate 2 (a side of the substrate 2 that extends in the X-direction) in a linear form. The two or more light emitting elements 6 are arranged at high density in a portion of the upper surface of the substrate 2 that is positioned on the inner side of the resin dam 9. More specifically, the two or more light emitting elements 6 are arranged such that a larger number of light emitting elements 6 per row are present near the center of the circular ring defined by the resin dam 9 and the number of light emitting elements 6 per row decreases as they approach the periphery of the substrate 2 (the outer side of the circular ring in radial direction) from the center of the circular ring. In the example shown in FIG. 1, twelve light emitting elements 6 connected in series form one row, and twelve such rows are connected in parallel.

The light emitting element 6 preferably has a structure in which light is emitted from its upper surface. The light emitting element 6 preferably has, on its surface, an electrode pad for connecting with the neighboring light emitting elements 6 via the wire 7 and an electrode pad for connecting the light emitting element 6 with the wiring pattern 3 (3*a*, 3*k*) (for example, an anode electrode pad and a cathode electrode pad).

The light emitting element 6 may alternatively have a structure in which light is emitted from its bottom surface. In such an implementation, wiring equivalent to the wire 7 and the electrode land 4 are first formed on the upper surface of the substrate 2. Then, the electrode pads formed on the surface of the light emitting element 6 are placed opposite the upper surface of the substrate 2, and the light emitting element 6 is connected with the substrate 2 via bumps by flip chip connection. In this manner, a light emitting element 6 structured to emit light from the bottom surface can be mounted on the upper surface of the substrate 2. Also, only one or two or more light emitting elements 6 may be provided.

(Printed Resistance Element)

The printed resistance element 8 is included for the purpose of increasing the electrostatic discharge withstand voltage. As shown in FIG. 1, the printed resistance element 8 is provided such that it connects one end of the wiring pattern 3*a* with one end of the wiring pattern 3*k* and has a shape of a section of a circular ring (an arc shape). The printed resistance element 8 is preferably a Zener diode, for example. The light emitting device 1 in this embodiment may omit the printed resistance element 8.

(Resin Dam)

The resin dam 9 is resin for containing the sealing resin layer 5 and is preferably formed from colored material (preferably a white or opaque white material). The resin dam 9 is preferably formed so as to cover the circular ring portion formed by the wiring pattern 3 and the printed resistance element 8 as shown in FIG. 1(*b*).

While the light emitting device 1 has been described, the first green phosphor 10, the second green phosphor 11, and the red phosphor 12 may be fabricated according to any method selected from known fabrication methods or obtained as off-the-shelf products. The same applies to the second embodiment described later.

The features (such as material, size, or shape) of the substrate 2, wiring pattern 3 (3*a*, 3*k*), electrode land 4 (4*a*, 4*k*), the transparent resin contained in the sealing resin layer 5, light emitting elements 6, wire 7, printed resistance element 8, and resin dam 9 are not limited to the foregoing descriptions.

Second Embodiment

Figure 2:
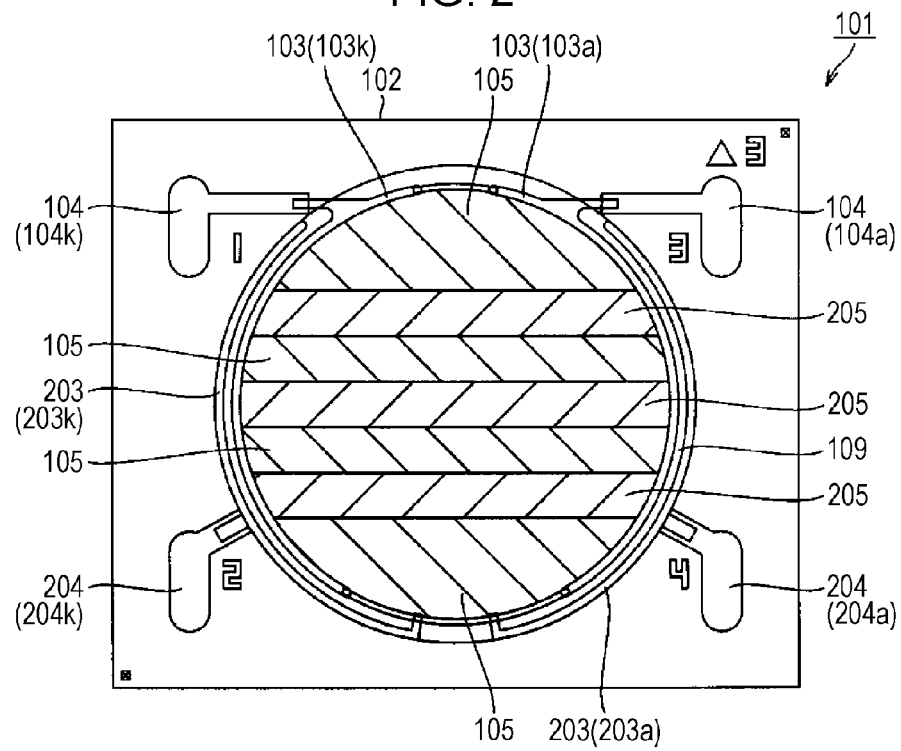
FIG. 2 is a schematic plan view of the light emitting device in an embodiment of the present invention.

FIG. 2 is a schematic plan view of an example of the light emitting device according to the second embodiment of the present invention. For the sake of simplicity, FIG. 2 does not illustrate light emitting elements, the first green phosphor, the second green phosphor, the red phosphor, wires, and the like.

A light emitting device 101 in this embodiment includes the first green phosphor, the second green phosphor, and the red phosphor described in the first embodiment. The light emitting device 101 in this embodiment accordingly has the light emission characteristics and light emission spectrum described in the first embodiment. Thus, the second embodiment provides the effects described in the first embodiment. The following description mainly focuses on the differences from the first embodiment.

The light emitting device 101 in this embodiment includes a substrate 102, a first wiring pattern 103 (103*a*, 103*k*), a second wiring pattern 203 (203*a*, 203*k*), a first electrode land 104 (104*a*, 104*k*), a second electrode land 204 (204*a*, 204*k*), a first sealing resin layer 105, a second sealing resin layer 205, a light emitting element (not shown), a wire (not shown), a printed resistance element (not shown), and a resin dam 109.

The resin dam 109 is formed on the upper surface of the substrate 102 in an annular shape when the upper surface of the substrate 102 is seen from above (an annular shape in plan view). In a portion of the upper surface of the substrate 102 that is positioned on the inner side of the resin dam 109, the first sealing resin layer 105, the second sealing resin layer 205, and at least one light emitting element (not shown) are disposed.

The first sealing resin layer 105 and the second sealing resin layer 205 each contain the first green phosphor, the second green phosphor, and the red phosphor. The first sealing resin layer 105 and the second sealing resin layer 205 differ from each other in the material, the proportions of mixture, or both the material and proportions of mixture of at least one of the first green phosphor, the second green phosphor, and the red phosphor. This facilitates the adjustment of the light emission characteristics of the light emitting device 101 (for example, the shape of the light emission spectrum of the light emitting device 101).

The first wiring pattern 103 (103a, 103k) is formed on the upper surface of the substrate 102 and partially covered by the resin dam 109. The first electrode land 104 (104a, 104k) is formed in a portion of the upper surface of the substrate 102 that is positioned on the outer side of the resin dam 109. The first electrode land 104a is connected to one end of the first wiring pattern 103a via a lead wire, while the first electrode land 104k is connected to one end of the first wiring pattern 103k via another lead wire. The wire electrically connects at least the light emitting element and the first wiring pattern 103 (103a, 103k) with each other. When two or more light emitting elements are provided, the light emitting elements are preferably interconnected via the wire.

Similarly, the second wiring pattern 203 (203a, 203k) is formed on the upper surface of the substrate 102 and partially covered by the resin dam 109. The second electrode land 204 (204a, 204k) is formed in a portion of the upper surface of the substrate 102 that is positioned on the outer side of the resin dam 109. The second electrode land 204a is connected to one end of the second wiring pattern 203a via a lead wire, while the second electrode land 204k is connected to one end of the second wiring pattern 203k via another lead wire. The wire electrically connects at least the light emitting element and the second wiring pattern 203 (203a, 203k) with each other. When two or more light emitting elements are provided, the light emitting elements are preferably interconnected via the wire.

While the light emitting device 101 has been described, the features (such as material, size, or shape) of the substrate 102, first wiring pattern 103 (103a, 103k), second wiring pattern 203 (203a, 203k), first electrode land 104 (104a, 104k), second electrode land 204 (204a, 204k), the transparent resin contained in the first sealing resin layer 105 and the second sealing resin layer 205, the light emitting element, the wire, the printed resistance element, and the resin dam 109 are not limited to the descriptions in the first embodiment.

Summarization of Embodiments

A light emitting device 1, 101 shown in FIG. 1 or 2 includes at least one light emitting element 6 that emits light having the peak emission wavelength in a wavelength range from 380 nm to 480 nm inclusive, a first green phosphor 10 that is excited by the primary light emitted by the light emitting element 6 and emits light having the peak emission wavelength in the green region, a second green phosphor 11 that is excited by the primary light and emits light having the peak emission wavelength in the green region, and a red phosphor 12 that is excited by the primary light and emits light having the peak emission wavelength in the red region. The peak emission wavelength of the light emitted by the second green phosphor 11 is shorter than the peak emission wavelength of the light emitted by the first green phosphor 10. This can enhance the color rendering properties of the light emitting device 1, 101. In addition, the light emission intensity in the blue region (a region with wavelengths of from 380 nm to 480 nm inclusive) and the light emission intensity in the yellow region (a region with wavelengths of from 540 nm to 580 nm inclusive) can be reduced.

The light emission spectrum of the light emitting device 1, 101 preferably has a first peak with a first emission peak wavelength in a wavelength range from 380 nm to 480 nm inclusive, a second peak with a second emission peak wavelength in a wavelength range from 485 nm to 580 nm inclusive, and a third peak with a third emission peak wavelength in a wavelength range from 610 nm to 660 nm inclusive. In the light emission spectrum, the first light emission intensity $I_1$ is preferably lower than the second light emission intensity $I_2$, and is preferably lower than the third light emission intensity $I_3$. The second light emission intensity $I_2$ is preferably lower than the third light emission intensity $I_3$. The light emission spectrum preferably has a shape that projects to the side of lower light emission intensity in a range of wavelengths longer than the second emission peak wavelength and shorter than the third emission peak wavelength. This can further reduce the light emission intensities in the blue and yellow regions.

In the light emission spectrum of the light emitting device 1, 101, a light emission intensity ratio of the first light emission intensity $I_1$ to the third light emission intensity $I_3$ ($I_1/I_3 \times 100$) is more preferably from 35.7 to 47.1 inclusive; the light emission intensity ratio of the second light emission intensity $I_2$ to the third light emission intensity $I_3$ ($I_2/I_3 \times 100$) is more preferably from 43.9 to 59.1 inclusive; the light emission intensity ratio of a fourth light emission intensity $I_4$ to the third light emission intensity $I_3$ ($I_4/I_3 \times 100$) is more preferably from 45.5 to 54.6 inclusive; the light emission intensity ratio of a fifth light emission intensity $I_5$ to the third light emission intensity $I_3$ ($I_5/I_3 \times 100$) is more preferably from 52.1 to 61.5 inclusive; and the light emission intensity ratio of a sixth light emission intensity $I_6$ to the third light emission intensity $I_3$ ($I_6/I_3 \times 100$) is more preferably from 60.2 to 72.7 inclusive. More preferably, the light emitting device 1, 101 emits light having a correlated color temperature of from 2757 K to 3113 K inclusive. This can further decrease the light emission intensity in the yellow region.

The excitation spectrum of the second green phosphor 11 preferably has an excitation peak in each of a wavelength range from 380 nm to 480 nm inclusive, which is the wavelength region in which the peak emission wavelength of the light emitted by the light emitting element 6 is present, and a wavelength range with shorter wavelengths than the wavelength region in which the peak emission wavelength of the light emitted by the light emitting element 6 is present. This enables provision of a light emitting device 1, 101 having desired light emission characteristics.

The light emitting device 1 shown in FIG. 1, for example, preferably further includes a substrate 2, and a resin dam 9 of an annular shape in plan view, a wiring pattern 3 (3a, 3k), an electrode land 4 (4a, 4k), and a wire 7, which are provided on the upper surface of the substrate 2. In a portion of the upper surface of the substrate 2 that is positioned on the inner side of the resin dam 9, at least one light emitting element 6, and a sealing resin layer 5 containing the first green phosphor 10, the second green phosphor 11, and the red phosphor 12 are preferably provided. At least part of the wiring pattern 3 (3a, 3k) is preferably covered by the resin dam 9. The electrode land 4 (4a, 4k) is preferably provided in a portion of the upper surface of the substrate 2 that is positioned on the outer side of the resin dam 9, and preferably is electrically connected with the wiring pattern 3 (3a, 3k). The wire 7 preferably electrically connects at least the light emitting element 6 and the wiring pattern 3 (3a, 3k) with each other.

EXAMPLES

The present invention will be described in greater detail by referencing examples, though the present invention is not limited to them. In the examples shown below, the light emitting device illustrated in FIG. 1 was produced and its light emission characteristics were examined.

Examples 1 to 3

The light emitting devices in Examples 1 to 3 each contained $Lu_{3-x}Ce_xAl_5O_{12}$-based phosphor ($Lu_3Al_5O_{12}$:$Ce^{3+}$) as the first green phosphor, $BaSi_2(O,Cl)_2N_2$:Eu phosphor ($BaSi_2(O,Cl)_2N_2$:$Eu^{2+}$) as the second green phosphor, and $CaAlSiN_3$:Eu-based phosphor ($CaAlSiN_3$:$Eu^{2+}$) as the red phosphor. The second green phosphor used had an average particle diameter of from 10 μm to 20 μm inclusive and a density of from 3.3 g/cm$^3$ to 3.5 g/cm$^3$ inclusive. The ratio of combination of the first green phosphor, the second green phosphor, and the red phosphor was adjusted so that the light emitted by the light emitting device had a correlated color temperature $T_{cp}$ of around 2900 K. The phosphors were combined in the amounts shown in Table 1 in the individual examples.

Examples 4 to 6

The light emitting devices in Examples 4 to 6 each contained $Lu_{3-x}Ce_xAl_5O_{12}$-based phosphor ($Lu_3Al_5O_{12}$:$Ce^{3+}$) as the first green phosphor, $BaSi_2(O,Cl)_2N_2$:Eu phosphor ($BaSi_2(O,Cl)_2N_2$:$Eu^{2+}$) as the second green phosphor, and (Sr,Ca)$AlSiN_3$:Eu-based phosphor ((Sr,Ca)$AlSiN_3$:$Eu^{2+}$) as the red phosphor. The second green phosphor used had an average particle diameter of from 10 μm to 20 μm inclusive and a density of from 3.3 g/cm$^3$ to 3.5 g/cm$^3$ inclusive. The ratio of combination of the first green phosphor, the second green phosphor, and the red phosphor was adjusted so that the light emitted by the light emitting device had a correlated color temperature $T_{cp}$ of around 2900 K. The phosphors were combined in the amounts shown in Table 1 in the individual examples.

The light emission spectrum of each light emitting device manufactured was measured to determine the first to sixth light emission intensities $I_1$ to $I_6$. In conformance to JIS Z 8725 (methods for determining the distribution temperature and color temperature or correlated color temperature of a light source), the correlated color temperature $T_{cp}$ of the light emitted by each light emitting device was determined. Also, by JIS Z 8726:1990 (methods for evaluating the color rendering properties of a light source), the average color rendering index Ra of each light emitting device was determined

Comparative Example 1

A light emitting device as Comparative Example 1 contained $Lu_{3-x}Ce_xAl_5O_{12}$-based phosphor ($Lu_3Al_5O_{12}$:$Ce^{3+}$) as the first green phosphor and $CaAlSiN_3$:Eu-based phosphor($CaAlSiN_3$:$Eu^{2+}$) as the red phosphor, but did not contain the second green phosphor. The ratio of combination of the first green phosphor and the red phosphor was adjusted so that the light emitted by the light emitting device had a correlated color temperature $T_{cp}$ of around 2900 K. The phosphors were combined in the amounts shown in Table 1 in the comparative example.

By the methods mentioned in Examples 1 to 6, the first to sixth light emission intensities $I_1$ to $I_6$ were determined, the correlated color temperature $T_{cp}$ of the light emitted by the light emitting device was determined, and the average color rendering index Ra of the light emitting device was determined.

TABLE 1

|  |  | EXAMPLE 1 | EXAMPLE 2 | EXAMPLE 3 | EXAMPLE 4 |
|---|---|---|---|---|---|
| Amount contained*[11] (pts. mass) | Transparent resin | 100 | 100 | 100 | 100 |
|  | First green phosphor ($Lu_3Al_5O_{12}$:$Ce^{3+}$) | 20.0 | 20.0 | 20.0 | 20.0 |
|  | Second green phosphor ($BaSi_2(O,Cl)_2N_2$:$Eu^{2+}$) | 7.1 | 7.1 | 7.1 | 7.0 |
|  | Red phosphor ($CaAlSiN_3$:$Eu^{2+}$) | 7.1 | 7.1 | 7.1 | 0.0 |
|  | Red phosphor ((Sr,Ca)$AlSiN_3$:$Eu^{2+}$) | 0.0 | 0.0 | 0.0 | 5.0 |
| Peak emission wavelength of light emitting element (nm) |  | 445 | 447 | 450 | 445 |
| Light emission intensity ratio*[12] | First light emission intensity $I_1$ | 38.8 | 37.1 | 35.7 | 47.1 |
|  | Second light emission intensity $I_2$ | 51.8 | 47.6 | 43.9 | 54.4 |
|  | Third light emission intensity $I_3$ | 100 | 100 | 100 | 100 |
|  | Fourth light emission intensity $I_4$ | 49.2 | 46.7 | 45.5 | 48.3 |
|  | Fifth light emission intensity $I_5$ | 53.8 | 52.4 | 52.1 | 55.4 |
|  | Sixth light emission intensity $I_6$ | 61.3 | 60.4 | 60.2 | 67.8 |
| Correlated color temperature $T_{cp}$ (K) |  | 2948 | 2822 | 2757 | 2950 |
| Average color rendering index Ra |  | 92.0 | 92.9 | 93.5 | 91.6 |

TABLE 1-continued

|  |  | EXAMPLE 5 | EXAMPLE 6 | COMPARATIVE EXAMPLE 1 |
|---|---|---|---|---|
| Amount contained*[11] (pts. mass) | Transparent resin | 100 | 100 | 100 |
|  | First green phosphor ($Lu_3Al_5O_{12}:Ce^{3+}$) | 20.0 | 20.0 | 33.8 |
|  | Second green phosphor ($BaSi_2(O,Cl)_2N_2:Eu^{2+}$) | 7.0 | 7.0 | 0.0 |
|  | Red phosphor ($CaAlSiN_3:Eu^{2+}$) | 0.0 | 0.0 | 8.8 |
|  | Red phosphor ($(Sr,Ca)AlSiN_3:Eu^{2+}$) | 4.2 | 3.8 | 0.0 |
| Peak emission wavelength of light emitting element (nm) |  | 445 | 445 | 445 |
| Light emission intensity ratio*[12] | First light emission intensity $I_1$ | 45.9 | 45.3 | 47.9 |
|  | Second light emission intensity $I_2$ | 52.9 | 59.1 | 39.1 |
|  | Third light emission intensity $I_3$ | 100 | 100 | 100 |
|  | Fourth light emission intensity $I_4$ | 50.7 | 54.6 | 60.7 |
|  | Fifth light emission intensity $I_5$ | 58.0 | 61.5 | 67.2 |
|  | Sixth light emission intensity $I_6$ | 69.9 | 72.7 | 72.6 |
| Correlated color temperature $T_{cp}$ (K) |  | 2975 | 3113 | 3037 |
| Average color rendering index Ra |  | 93.5 | 94.4 | 96.0 |

In Table 1, the "Amount contained*[11] (pts.mass)" section shows the amount of content of each phosphor, where the amount of content of transparent resin is defined as 100 pts.mass. The "Light emission intensity ratio*[12]" section shows the individual light emission intensities, where the third light emission intensity $I_3$ is defined as 100.

<Results>

Figure 3:
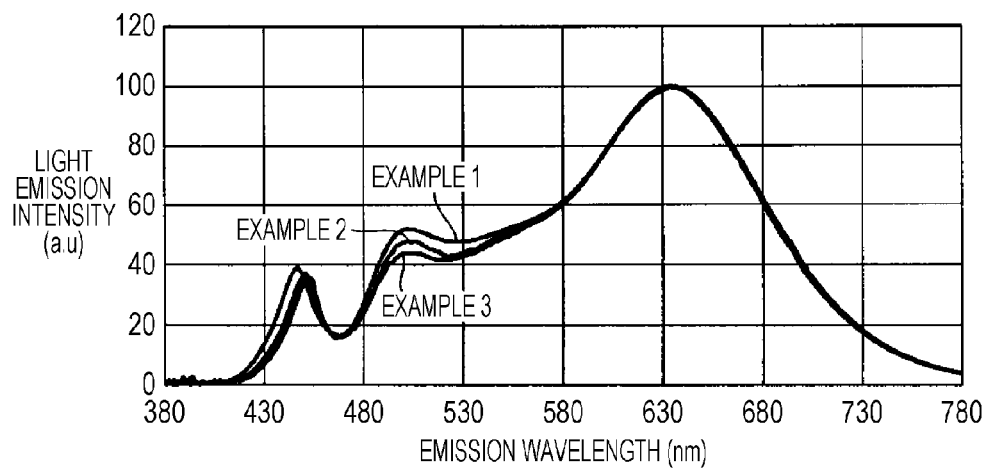
FIG. 3 shows the light emission spectral distribution of the light emitting devices in Examples 1 to 3.
Figure 4:
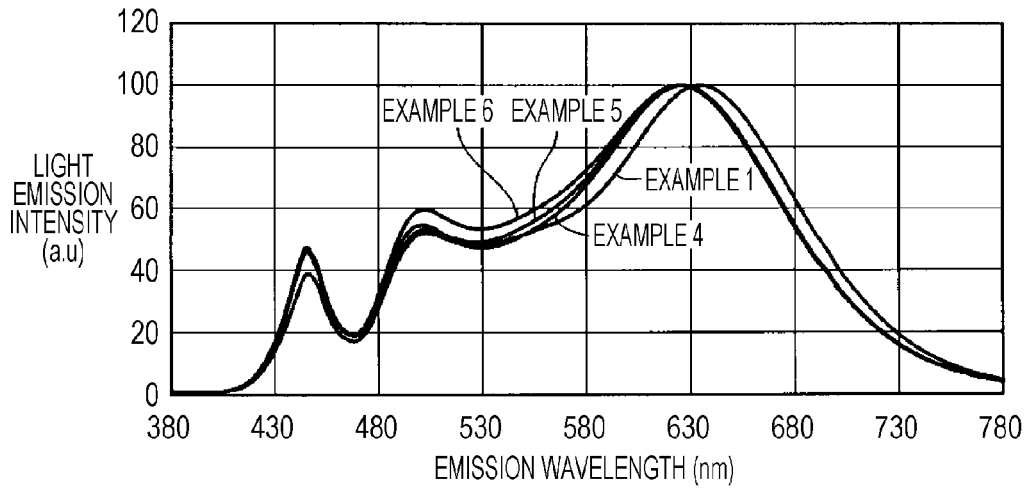
FIG. 4 shows the light emission spectral distribution of the light emitting devices in Examples 1 and 4 to 6.
Figure 5:
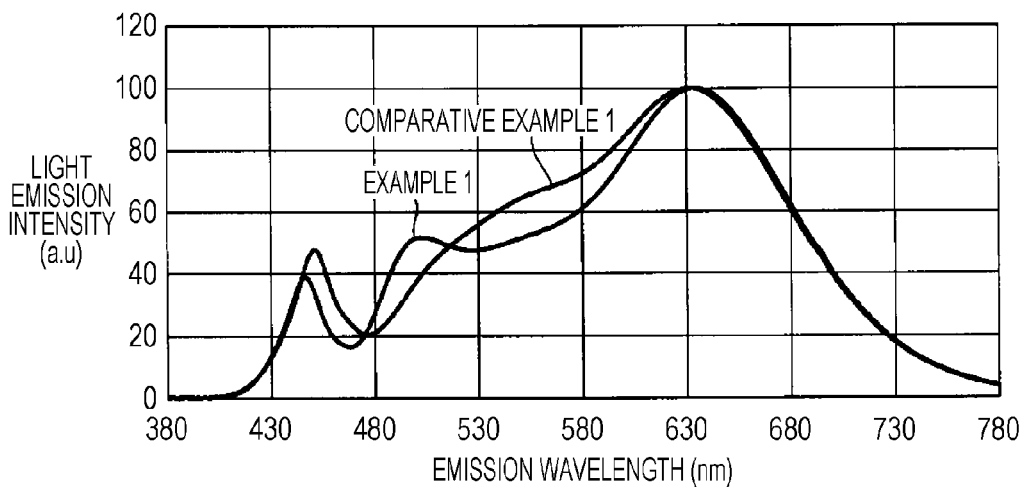
FIG. 5 shows the light emission spectral distribution of the light emitting devices in Example 1 and Comparative Example 1.
Figure 6:
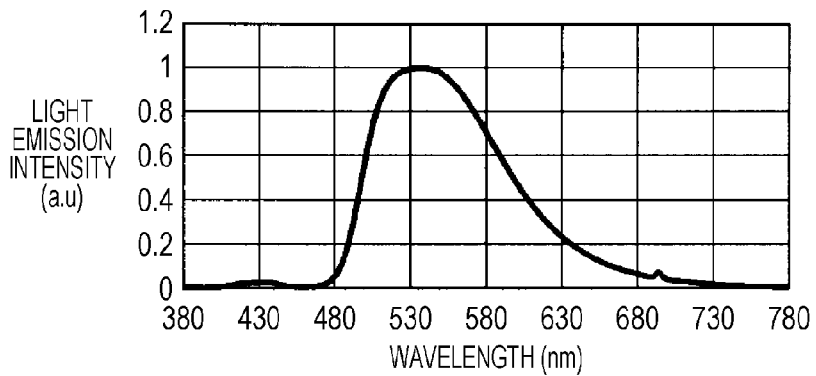
FIG. 6 shows the light emission spectral distribution of an example of the first green phosphor.
Figure 7:
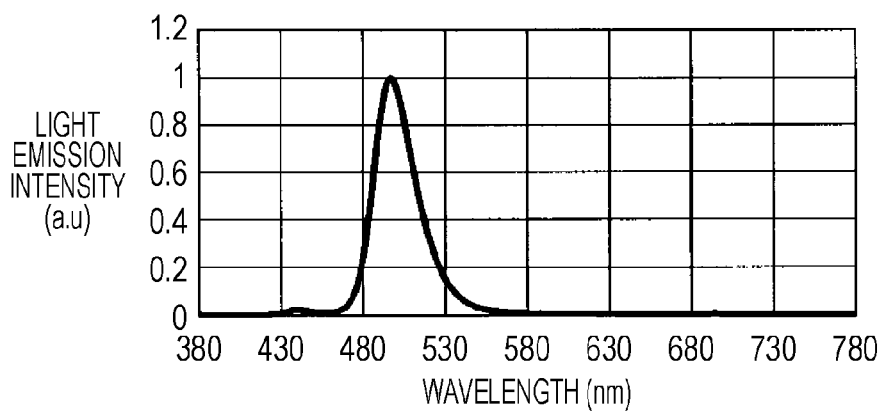
FIG. 7 shows the light emission spectral distribution of an example of the second green phosphor.
Figure 8:
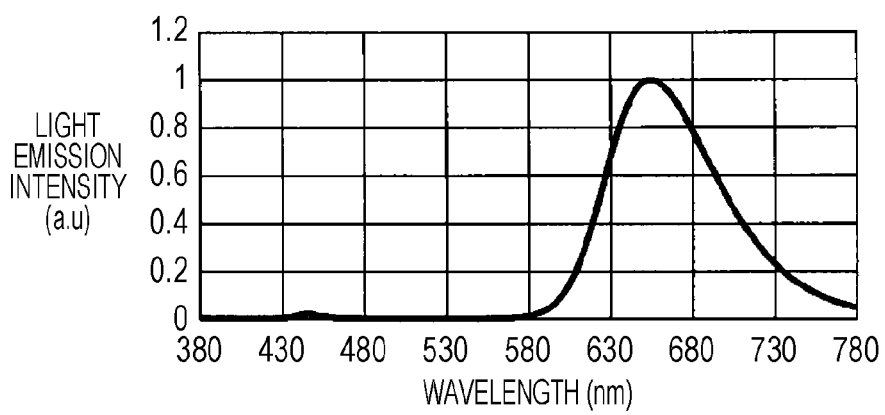
FIG. 8 shows the light emission spectral distribution of an example of the red phosphor ($CaAlSiN_3:Eu^{2+}$).
Figure 9:
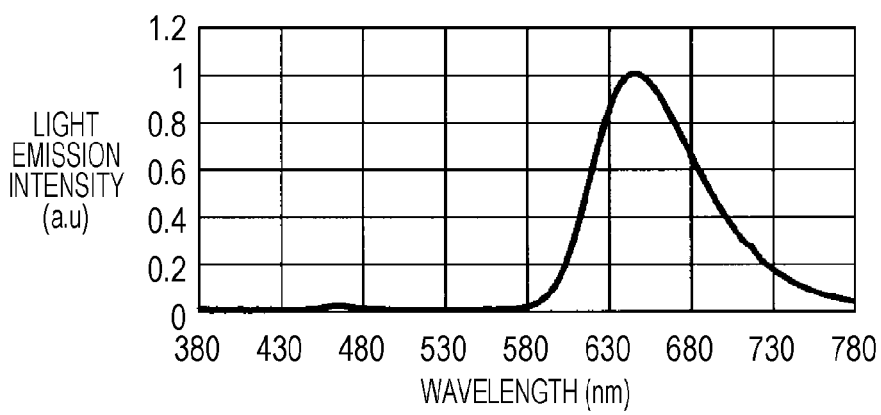
FIG. 9 shows the light emission spectral distribution of another example of the red phosphor ($(Sr, Ca)AlSiN_3:Eu^{2+}$).

The results are shown in Table 1 and FIGS. 3 to 5. FIG. 3 shows the light emission spectra of the light emitting devices of Examples 1 to 3, FIG. 4 shows the light emission spectra of the light emitting devices in Examples 1 and 4 to 6, and FIG. 5 shows the light emission spectra of the light emitting devices of Example 1 and Comparative Example 1. FIGS. 6 to 9 respectively show the light emission spectra of the first green phosphor, the second green phosphor, and the red phosphor used in the examples. In FIGS. 3 to 9, the horizontal axis represents the wavelength (nm), and the vertical axis represents the light emission intensity (in an arbitrary unit).

In Example 1, the light emission intensity in the blue region (the wavelength region from 380 nm to 480 nm inclusive) was low and that in the yellow region (the wavelength region from 540 nm to 580 nm inclusive) was low compared to Comparative Example 1 (FIG. 5).

In Examples 2 and 3, the light emitting elements had different peak emission wavelengths than Example 1. In Examples 2 and 3, however, the light emission intensity in the blue region was also low and that in the yellow region was low relative to Comparative Example 1 (FIGS. 3 and 5).

Examples 4 to 6 used (Sr,Ca)AlSiN$_3$:Eu-based phosphor (($Sr,Ca)AlSiN_3:Eu^{2+}$) as the red phosphor and contained the red phosphor in different amounts than in Example 1. In Examples 4 to 6, however, the light emission intensity in the blue region was also low and that in the yellow region was low relative to Comparative Example 1 (FIGS. 4 and 5).

The light emission spectrum of Examples 1 to 6 had a shape projecting to the side of lower light emission intensity in a wavelength range from 500 nm to 630 nm. In the light emission spectrum of Comparative Example 1, in contrast, the light emission intensity increased as the wavelength became longer in the wavelength range from 500 nm to 630 nm (FIGS. 3 to 5).

From the foregoing, it is believed that a white object can be made look clear white when it is illuminated with the light from the light emitting devices of Examples 1 to 6.

Also, a black object is believed to look clear black when illuminated with the light from the light emitting devices of Examples 1 to 6.

The embodiments and examples disclosed herein are to be construed as illustrative and not limitative in all respects. For example, the present invention can also be applied to a light emitting device such as a side-emitting LED or surface mounted LED. Further, the light emitting device can be incorporated into a lighting fixture such as a downlight or a spotlight. The scope of the present invention is shown by Claims rather than the foregoing description, and is intended to encompass meanings equivalent to Claims and all the modifications falling in the scope of Claims.

REFERENCE SIGNS LIST 1, 101 light emitting device
2, 102 substrate
3, 3a, 3k wiring pattern
4, 4a, 4k electrode land
5 sealing resin layer
6 light emitting element
7 wire
8 printed resistance element
9, 109 resin dam
10 first green phosphor
11 second green phosphor
12 red phosphor
103, 103a, 103k first wiring pattern
104, 104a, 104k first electrode land
105 first sealing resin layer
203, 203a, 203k second wiring pattern
204, 204a, 204k second electrode land
205 second sealing resin layer

The invention claimed is:

1. A light emitting device comprising:
    at least one light emitting element that emits light having a peak emission wavelength in a wavelength range from 380 nm to 480 nm inclusive;
    a first green-yellow phosphor that is excited by primary light emitted by the at least one light emitting element and emits light having a peak emission wavelength in a green-yellow region;

a second green-yellow phosphor that is excited by the primary light and emits light having another peak emission wavelength in the green-yellow region; and a red phosphor that is excited by the primary light and emits light having an emission wavelength in a red region, the peak emission wavelength of the light emitted by the second green-yellow phosphor being shorter than the peak emission wavelength of the light emitted by the first green-yellow phosphor, wherein a light emission spectrum of the light emitting device has a first peak with a first emission peak wavelength in a wavelength range from 380 nm to 480 nm inclusive, a second peak with a second emission peak wavelength in a wavelength range from 485 nm to 580 nm inclusive, and a third peak with a third emission peak wavelength in a wavelength range from 610 nm to 660 nm inclusive, in the light emission spectrum, a first light emission intensity at the first emission peak wavelength is lower than a second light emission intensity at the second emission peak wavelength and is lower than a third light emission intensity at the third emission peak wavelength, and the second light emission intensity at the second emission peak wavelength is lower than the third light emission intensity at the third emission peak wavelength, and the light emission spectrum has a shape that projects to a side of lower light emission intensity in a range of wavelengths longer than the second emission peak wavelength and shorter than the third emission peak wavelength, wherein in the light emission spectrum, when the first light emission intensity is represented as I1, the second light emission intensity is represented as I2, the third light emission intensity is represented as I3, a fourth light emission intensity at a wavelength of 540 nm is represented as I4, a fifth light emission intensity at a wavelength of 560 nm is represented as I5, and a sixth light emission intensity at a wavelength of 580 nm is represented as I6, a light emission intensity ratio of the first lit emission intensity I1 to the third light emission intensity I3 (I1/I3×100) is from 35.7 to 47.1 inclusive, the light emission intensity ratio of the second light emission intensity I2 to the third light emission intensity I3 (I2/I3×100) is from 43.9 to 59.1 inclusive, the light emission intensity ratio of the fourth light emission intensity I4 to the third light emission intensity I3 (I4/I3×100) is from 45.5 to 54.6 inclusive, the light emission intensity ratio of the fifth light emission intensity I5 to the third light emission intensity I3 (I5/I3×100) is from 52.1 to 61.5 inclusive, the light emission intensity ratio of the sixth light emission intensity I6 to the third light emission intensity I3 (I6/I3×100) is from 60.2 to 72.7 inclusive.

2. The light emitting device according to claim 1, wherein the light emitting device emits light having a correlated color temperature of from 2757 K to 3113 K inclusive.

3. The light emitting device according to claim 1, wherein an excitation spectrum of the second green-yellow phosphor has an excitation peak in each of a wavelength range from 380 nm to 480 nm inclusive, which is a wavelength region in which the peak emission wavelength of the light emitted by the light emitting element is present, and a wavelength range with shorter wavelengths than the wavelength region in which the peak emission wavelength of the light emitted by the light emitting element is present.

4. The light emitting device according to claim 1, further comprising:

a substrate; and a resin dam of an annular shape in plan view, a wiring pattern, an electrode land, and a wire, which are provided on an upper surface of the substrate, wherein in a portion of the upper surface of the substrate that is positioned on an inner side of the resin dam, the at least one light emitting element and a sealing resin layer containing the first green-yellow phosphor, the second green-yellow phosphor, and the red phosphor are provided, at least part of the wiring pattern is covered by the resin dam, the electrode land is provided in a portion of the upper surface of the substrate that is positioned on an outer side of the resin dam, and is electrically connected with the wiring pattern, and the wire electrically connects at least the light emitting element and the wiring pattern with each other.

5. The light emitting device according to claim 1 wherein a difference between the peak emission wavelength of the light emitted by the first green-yellow phosphor and the peak emission wavelength of the light emitted by the second green-yellow phosphor is 20 nm or more.

* * * * *